(12) United States Patent
Hoentschel et al.

(10) Patent No.: US 7,329,571 B2
(45) Date of Patent: Feb. 12, 2008

(54) TECHNIQUE FOR PROVIDING MULTIPLE STRESS SOURCES IN NMOS AND PMOS TRANSISTORS

(75) Inventors: Jan Hoentschel, Neustadt in Sachsen (DE); Andy Wei, Dresden (DE); Manfred Horstmann, Duerrrohrsdorf-Dittersbach (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/466,802

(22) Filed: Aug. 24, 2006

(65) Prior Publication Data

US 2007/0096195 A1 May 3, 2007

(30) Foreign Application Priority Data

Oct. 31, 2005 (DE) ...................... 10 2005 052 054

(51) Int. Cl.
*H01L 21/8238* (2006.01)
*H01L 21/336* (2006.01)
*H01L 21/44* (2006.01)

(52) U.S. Cl. ...................... 438/199; 438/257; 438/231; 438/682; 257/192; 257/315; 257/344; 257/734; 257/E21.051

(58) Field of Classification Search ................ 438/199, 438/257, 231, 682; 257/192, 315, 344, 734, 257/E21.051
See application file for complete search history.

(56) References Cited

U.S. PATENT DOCUMENTS

| | | | |
|---|---|---|---|
| 2003/0181005 A1 | 9/2003 | Hachimine et al. | 438/231 |
| 2005/0035470 A1 | 2/2005 | Ko et al. | 257/900 |
| 2005/0148133 A1 | 7/2005 | Chen et al. | 438/199 |
| 2005/0156237 A1* | 7/2005 | Grudowski | 257/346 |
| 2005/0266639 A1* | 12/2005 | Frohberg et al. | 438/257 |
| 2006/0003510 A1* | 1/2006 | Kammler et al. | 438/198 |

* cited by examiner

*Primary Examiner*—Michael Lebentritt
*Assistant Examiner*—Mohsen Ahmadi
(74) *Attorney, Agent, or Firm*—Williams, Morgan & Amerson, P.C.

(57) ABSTRACT

By combining a plurality of stress inducing mechanisms in each of different types of transistors, a significant performance gain may be obtained, thereby providing enhanced flexibility in adjusting product specific characteristics. For this purpose, sidewall spacers with high tensile stress may be commonly formed on PMOS and NMOS transistors, wherein a deleterious effect on the PMOS transistor may be compensated for by a corresponding compressively stressed contact etch stop layer, while the NMOS transistor comprises a contact etch stop layer with tensile stress. Furthermore, the PMOS transistor comprises an embedded strained semiconductor layer for efficiently creating compressive strain in the channel region.

29 Claims, 6 Drawing Sheets

TECHNIQUE FOR PROVIDING MULTIPLE STRESS SOURCES IN NMOS AND PMOS TRANSISTORS

BACKGROUND OF THE INVENTION

1. Field of the Invention

Generally, the present invention relates to the formation of integrated circuits, and, more particularly, to the formation of different transistor types having strained channel regions by using embedded silicon/germanium to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length may usually also require reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, providing increased conductivity of the raised drain and source regions, while at the same time maintaining a shallow PN junction with respect to the gate insulation layer.

Since the continuous size reduction of the critical dimensions, i.e., the gate length of the transistors, necessitates the adaptation and possibly the new development of highly complex process techniques concerning the above-identified process steps, it has been proposed to also enhance the channel conductivity of the transistor elements by increasing the charge carrier mobility in the channel region for a given channel length, thereby offering the potential for achieving a performance improvement that is comparable with the advance to a future technology node, while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region increases the mobility of electrons, wherein, depending on the magnitude and direction of the tensile strain, an increase in mobility of 50% or more may be obtained, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium layer or a silicon/carbon layer in or below the channel region to create tensile or compressive stress that may result in a corresponding strain. Although the transistor performance may be considerably enhanced by the introduction of stress-creating layers in or below the channel region, significant efforts have to be made to implement the formation of corresponding stress layers into the conventional and well-approved MOS technique. For instance, additional epitaxial growth techniques have to be developed and implemented into the process flow to form the germanium or carbon-containing stress layers at appropriate locations in or below the channel region. Hence, process complexity is significantly increased, thereby also increasing production costs and the potential for a reduction in production yield.

Thus, in other approaches, external stress created by, for instance, overlaying layers, spacer elements and the like is used in an attempt to create a desired strain within the channel region. However, the process of creating the strain in the channel region by applying a specified external stress may suffer from an inefficient translation of the external stress into strain in the channel region. Hence, although providing significant advantages over the above-discussed approach requiring additional stress layers within the channel region, the efficiency of the stress transfer mechanism may depend on the process and device specifics and may result in a reduced performance gain for one type transistor.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked, and the silicon/germanium layer is subsequently selectively formed in the PMOS transistor by epitaxial growth. Although this technique offers significant advantages in view of performance gain of the PMOS transistor and thus of the entire CMOS device, an appropriate design may have to be used that balances the difference in performance gain of the PMOS transistor and the NMOS transistor.

In view of the above-described situation, there exists a need for an improved technique that enables efficient increase in performance of PMOS transistors and NMOS transistors, while substantially avoiding or at least reducing one or more of the above-identified problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of different types of transistors, such as PMOS and NMOS transistors, wherein, in each type of transistor, two or more stress sources for creating a respective desired strain in the channel region of each type of transistor is provided, thereby significantly enhancing process flexibility as the performance gain may be adjusted in a wide variety of ways for a given circuit design. For this purpose, in the PMOS transistor, a corresponding compressively strained semiconductor layer, formed in the respective drain and source region, may be provided with an additional stress creating source to more efficiently transfer stress from the strained semiconductor layer into the channel region. In this way, the charge carrier mobility and thus the electrical performance of both types of transistors may be efficiently increased without unduly contributing to process complexity.

According to one illustrative embodiment of the present invention, a semiconductor device comprises a first transistor of a first conductivity type, which comprises a first gate electrode with a first spacer structure formed at the sidewalls thereof, wherein the first spacer structure exhibits a first type of stress. The semiconductor device further comprises a second transistor of a second conductivity type, which comprises a second gate electrode with a second spacer structure formed at the sidewalls thereof and having the first type of stress. The second transistor further comprises a strained semiconductor region in a drain and source region. Moreover, a first stressed contact etch stop layer is formed above the first transistor element and has the first type of stress. Finally, a second stressed contact etch stop layer is formed above the second transistor element and has a second type of stress that differs from the first type.

According to another illustrative embodiment of the present invention, a method comprises forming a first gate electrode of a first transistor of a first type and forming a second gate electrode of a second transistor of a second type. Moreover, the method comprises forming a strained semiconductor layer in a recess formed adjacent to the second gate electrode. Furthermore, a first sidewall spacer structure is formed at the first gate electrode and a second sidewall spacer structure is formed at the second gate electrode, wherein the first and second sidewall spacer structures have a first type of stress. Additionally, the method comprises forming a first contact etch stop layer above the first transistor, wherein the first contact etch stop layer has the first type of stress. Finally, the method comprises forming a second contact etch stop layer above the second transistor, wherein the second contact etch stop layer has a second type of stress other than the first type.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally the present invention contemplates a technique for manufacturing transistor elements of different types of conductivity, such as NMOS transistors and PMOS transistors, wherein the charge carrier mobility of holes and electrons in the PMOS transistor and the NMOS transistor, respectively, is enhanced by providing a compressively strained semiconductor layer in the drain and source regions of the PMOS transistor, while the NMOS transistor has formed on a gate electrode thereof a sidewall spacer structure of high tensile stress. Moreover, in order to obtain a highly efficient and flexible manufacturing process, the respective sidewall spacer structures are formed in a common manufacturing process on both types of transistors, wherein additional stress inducing mechanisms are provided for compensating for or over-compensating for the effects of the highly tensile sidewall spacers at the PMOS transistor, while, on the other hand, enhancing the generation of a desired tensile strain in the respective channel region of the NMOS transistor. For this purpose, corresponding contact etch stop layers may be formed above the respective transistor types to enhance the effectiveness of the highly tensile sidewall spacer structure in the NMOS transistor while reducing or over-compensating for the effects of the highly tensile sidewall spacer structure in the PMOS transistor. Furthermore, in some illustrative embodiments, the manufacturing process is designed such that at least one of the contact etch stop layers may be formed directly on the respective transistor to further enhance the stress transfer mechanism in the respective transistor.

In still other illustrative embodiments, the process sequence for forming the epitaxially grown strained semiconductor layer in the PMOS transistor may be designed so as to obtain a high degree of symmetry with respect to the other transistor, thereby "smoothing" loading effects of the epitaxial growth process. For this purpose, the process sequence may be modified such that substantially no stress is created in the NMOS transistor, thereby avoiding or at least reducing any deleterious effects on the electron mobility while, on the other hand, a modified band gap in the NMOS transistor may provide a performance gain in terms of current drive capability. Consequently, any circuit designs that take into account the typically encountered asymmetry with respect to the current drive capability of PMOS and NMOS transistors may be substantially maintained, since both types of transistors may be significantly enhanced. That is, the PMOS transistor may receive a significantly enhanced hole mobility due to the highly efficient creation of compressive strain in the respective channel region due to the strained semiconductor layer in combination with a correspondingly stressed contact etch stop layer which may compensate for or over-compensate for the effect of the sidewall spacers having the high tensile stress. On the other hand, performance gain in the NMOS transistor may be accomplished by the provision of the highly tensile sidewall spacers in combination with a corresponding contact etch stop layer with a tensile stress, wherein, as previously explained, in some embodiments, a further increase of the current drive capability may be achieved due to a reduced source and drain junction resistance provided by the relaxed semiconductor compound in the drain and source regions.

Moreover, due to the provision of multiple stress inducing sources in each type of transistor, adjustment of transistor performance may be accomplished over a wide range for a given circuit design. The present invention may also be advantageously applied in combination with silicon-on-insulator (SOI) devices, in particular in combination with partially depleted SOI transistors, since the increased leakage current, which may be considered per se as a detrimental effect and which may be associated with the presence of a modified band gap compared to doped silicon, may result in enhanced charge carrier discharge and charge capability so as to significantly reduce the floating body effect, which is considered a major issue in partially depleted SOI transistors.

Consequently, in embodiments having a strained semiconductor layer in one type of transistor and the correspondingly relaxed semiconductor layer in the other transistor type, the hysteresis behavior, that is, the history dependent propagation delay of signals in partially depleted SOI transistors, may be significantly enhanced by providing more design flexibility, as typically extra margins have to be provided in conventional partially depleted SOI devices to take into account worst-case delay variations caused by a considerable hysteresis of partially depleted SOI devices. It should be appreciated, however, that the present invention is also highly advantageous in combination with other transistor architectures, such as transistors formed on bulk silicon substrates or any other appropriate carriers. Thus, the present invention should not be considered as restricted to SOI devices, unless such restrictions are explicitly set forth in the detailed description and the appended claims.

Figure 1A:
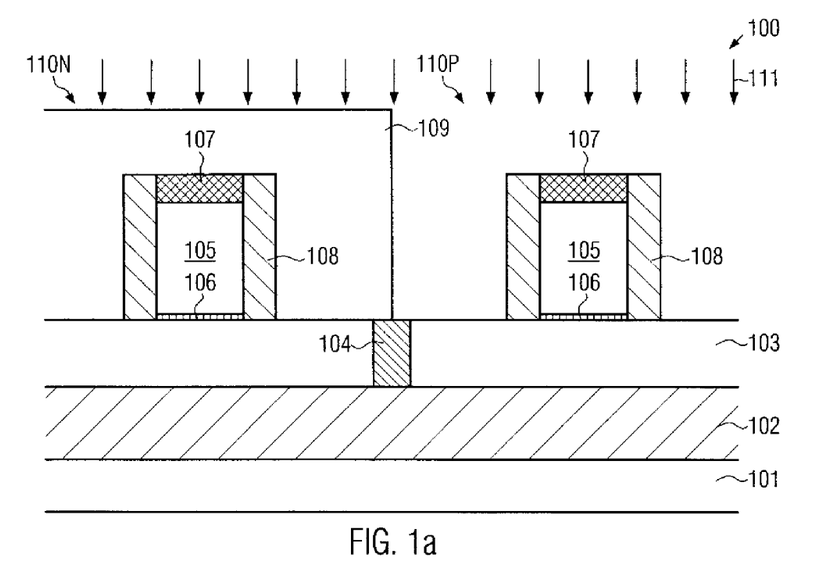
FIGS. 1a-1e schematically show cross-sectional views of a semiconductor device including two different types of transistors during various manufacturing stages in accordance with illustrative embodiments of the present invention, wherein one transistor has formed therein a strained semiconductor layer in the corresponding source and drain regions in combination with at least one second stress inducing source for creating the desired strain in the channel region, while the other transistor comprises at least two stress sources for creating a different type of strain in the respective channel region.

With reference to FIGS. 1a-1i and 2a-2c, further illustrative embodiments of the present invention will now be described in more detail. FIG. 1a schematically illustrates a cross-sectional view of a semiconductor device 100 comprising a substrate 101, in and on which are formed a first transistor 110N and a second transistor 110P. The first transistor 110N and the second transistor 110P differ in their conductivity type so that, for instance, the first transistor 110N may represent an NMOS transistor, while the second transistor 110P may represent a PMOS transistor. The substrate 101 may represent any appropriate substrate having formed thereon a substantially crystalline semiconductor layer 103 that enables the formation of the first and second transistors 110N, 110P. In one illustrative embodiment, the semiconductor layer 103 may represent a silicon-based semiconductor material, which may, in one illustrative embodiment, be formed on a buried insulating layer 102 so that the first and second transistors 110N, 110P may represent SOI-like transistors. In other embodiments, the semiconductor layer 103 may be formed on top of a bulk semiconductor substrate, where the first and second transistor elements 110N, 110P may represent bulk devices.

It should be appreciated that the substrate 101 having formed thereon the buried insulating layer 102, which may be comprised of silicon dioxide, silicon nitride or any other appropriate insulating material, is to represent any SOI-type substrate, wherein this term is to be considered as a generic term for any substrate having at least one insulating portion above which is formed a crystalline semiconductor layer that is appropriate for the formation of transistor elements therein. The semiconductor layer 103 may have a thickness that is adapted to the specific design rules for the transistors 110N, 110P. In one illustrative embodiment, the semiconductor layer 103 is designed so as to enable the formation of partially depleted transistor elements, while, in other embodiments, the thickness of the layer 103 may be appropriate for the formation of fully depleted devices or, in other cases, bulk devices may be formed in the layer 103. The transistors 110N, 110P may be separated and thus electrically insulated from each other by a corresponding isolation structure 104, which may be provided in the form of a shallow trench isolation (STI) or any other appropriate insulating structure. The isolation structure 104 may be comprised of any appropriate material, such as silicon dioxide, silicon nitride and the like. Moreover, in this stage of manufacture as is shown in FIG. 1a, the first and second transistors 110N, 110P each comprise a respective gate electrode 105, which are separated from the semiconductor layer 103 by respective gate insulation layers 106. Furthermore, each of the gate electrodes 105 may be "encapsulated" by a respective capping layer 107 and a spacer element 108. For example, the capping layers 107 and the spacers 108 may be formed of any appropriate material that may be removed selectively with respect to the transistor elements 110N, 110P and which may also reliably suppress the deposition of semiconductor material in a subsequent epitaxial growth process. For example, silicon nitride, silicon oxynitride and the like may be used as appropriate materials. Furthermore, a hard mask 109 is formed above the semiconductor device 100 in such a way that the first transistor 110N is covered, while the second transistor 110P is exposed to an anisotropic etch process 111. The hard mask 109 may, for instance, be formed from substantially the same materials as the capping layers 107 and the spacers 108.

A typical process flow for forming the semiconductor device 100 as shown in FIG. 1a may comprise the following processes. The substrate 101 including the buried insulating layer 102, when an SOI architecture is considered, may receive the semiconductor layer 103, for instance, in the form of an undoped or pre-doped crystalline silicon layer, wherein the silicon layer may be formed by wafer bond techniques or any other well-established techniques for providing SOI substrates. Thereafter, the isolation structure 104 may be formed on the basis of well-established recipes such as standard lithography and anisotropic etch techniques followed by appropriate deposition and polishing techniques, when the isolation structure 104 is to be provided in the form of a trench isolation. Next, an appropriate dielectric layer may be formed by oxidation and/or deposition followed by the deposition of a gate electrode material, such as polysilicon or pre-doped polysilicon, which may be accomplished by well-established low pressure chemical vapor deposition (LPCVD) techniques.

Thereafter, a capping layer may be formed on top of the gate electrode material, wherein the capping layer may also act as an anti-reflective coating (ARC) layer for a subsequently performed lithography process. Moreover, the capping layer may additionally or alternatively act as a hard mask during the subsequent patterning of the gate electrode material. In still other embodiments, the capping layer may be designed so as to be patterned commonly with the gate electrode material to finally form the respective capping layer 107 without having any further function during the preceding photolithography and etch processes. After the patterning of the gate electrodes 105 and the gate insulation layers 106, the spacer elements 108 may be formed by depositing a corresponding etch selective liner (not shown) and a spacer layer on the basis of, for instance, well-established plasma enhanced chemical vapor deposition (PECVD) techniques with a required thickness that substantially determines a desired offset for a recess to be formed adjacent to the gate electrode 105 of the second transistor 110P. Thereafter, a selective anisotropic etch process may be performed to remove excess material of the previously deposited spacer layer, thereby forming the spacers 108.

Next, a mask layer, which may include a liner material (not shown), may be deposited on the basis of well-established recipes and may be patterned on the basis of well-established photolithography to form the hard mask 109. Thereafter, the device 100 may be subjected to the anisotropic etch process 111, which may be designed to exhibit a high selectivity between the material of the semiconductor layer 103, on the one hand, and the materials of the spacers 108, the capping layers 107 and the isolation structure 104, on the other hand. For instance, highly selective anisotropic etch processes with a moderately high selectivity between silicon, silicon dioxide and silicon nitride are well established in the art. For example, similar etch techniques may also be used during the formation of the isolation structure 104. It should be appreciated that the etch process 111 may be controlled, for a given etch chemistry for otherwise fixed process parameters, by the etch time, wherein a certain dependence on pattern density and pattern structure may reduce controllability of the process 111. Therefore, in some illustrative embodiments, a reduction in the non-uniformity of pattern density may be achieved in performing the etch process 111 for both types of transistors simultaneously, as will be described in more detail with reference to FIGS. 2a-2c.

Figure 1B:
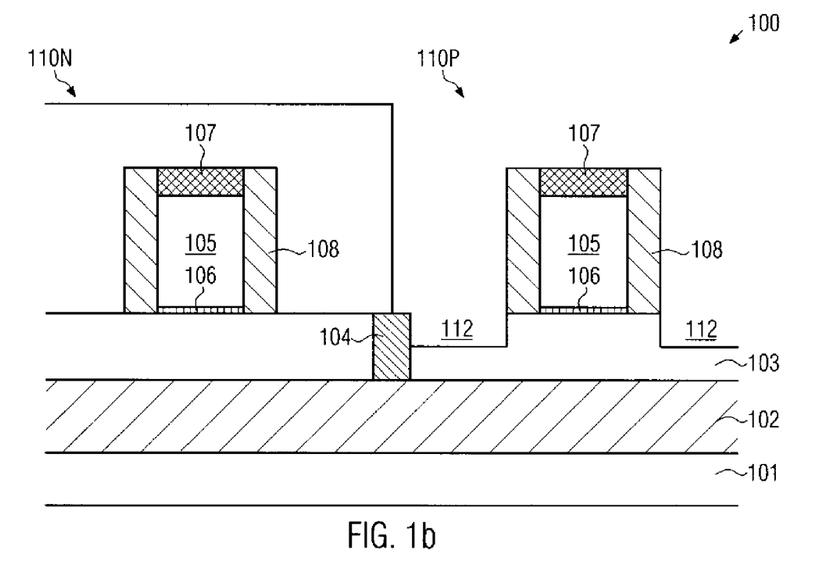

FIG. 1b schematically shows the semiconductor device 100 after the completion of the anisotropic process 111 that results in the formation of the recesses 112. Moreover, in order to prepare the device 100 for a subsequent epitaxial growth process, in which an appropriate semiconductor material may be deposited for forming a strained area adjacent to the gate electrode 105 of the second transistor 110P, appropriate well-established cleaning processes may have been performed to remove any contaminants on exposed surfaces within the recess 112 formed during the preceding etch process 111. Thereafter, an appropriate deposition atmosphere is provided on the basis of well-established recipes, wherein, in one embodiment, a deposition atmosphere may be designed so as to effect the deposition of a silicon/germanium material. During the epitaxial growth process, process parameters are selected such that substantially no material is deposited on the dielectric portions, such as the mask 109, the isolation structure 104, the capping layer 107 and the spacers 108. During the epitaxial growth of the semiconductor material within the recess 112, a strained semiconductor layer is formed, since the material deposited may have a different lattice spacing with respect to the surrounding semiconductor material of the layer 103, which acts as a crystalline template. In the case of silicon/germanium, the natural lattice spacing is higher compared to the silicon lattice spacing, and, thus, a compressively strained semiconductor layer is formed in the recess 112 during the epitaxial growth process. After the filling or over-filling (when raised drain and source regions are to be formed) of the recess 112 with the strained semiconductor layer, the mask 109 and the corresponding capping layers 107 and spacer elements 108 may be removed and the further processing may be continued by well-established techniques for the formation of MOS transistors.

Figure 1C:
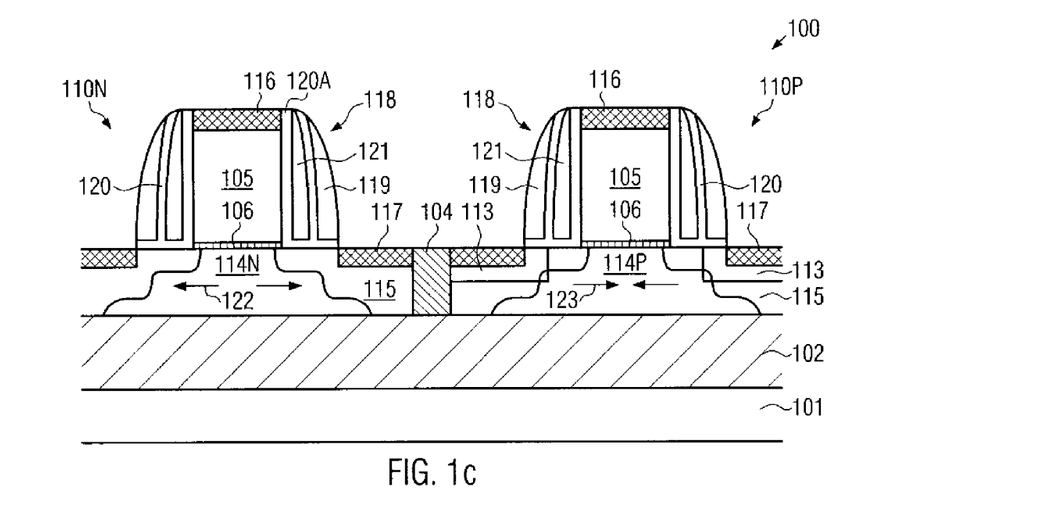

FIG. 1c schematically shows the semiconductor device 100 in a further advanced manufacturing stage. As shown, the second transistor 110P comprises a strained semiconductor layer 113, which may be comprised of silicon/germanium or any other appropriate semiconductor material that may be formed in a substantially crystalline fashion, while still providing a lattice mismatch to create a desired degree of strain in a channel region 114P. In the case of a compressively strained semiconductor layer 113, such as a silicon/germanium layer, a corresponding compressive strain 123 is also generated in the channel region 114P of the second transistor 110P. On the other hand, a corresponding strain mechanism is not provided in the first transistor 110N. Moreover, each of the first and second transistors 110N, 10P comprises drain and source regions 115, wherein a lateral and vertical dopant profile of the regions 115 is correspondingly adapted to the specific conductivity type of the respective transistor. That is, the source and drain region 115 of the first transistor 110N, when representing an N-channel transistor, may be highly N-doped while the respective channel region 114N may be slightly P-doped. A corresponding inverse dopant profile may be provided for the drain and source regions 115 and the channel region 114P of the second transistor 110P. Furthermore, each of the transistors 110N, 110P comprises a spacer structure 118 formed at sidewalls of the respective gate electrodes 115. The spacer structures 118 may comprise one or more sidewall spacers, such as spacers 119, 121, in combination with respective liners 120, wherein the number of spacer elements 119, 121 may depend on the complexity of the required lateral profile in the drain and source regions 115. The spacer structures 118 are formed so as to exhibit a specified type of stress, which is selected such that a desired type of strain is induced in the channel region 114N of the first transistor 110N. For example, the spacer structures 118 may have a high tensile intrinsic stress to induce a corresponding tensile strain 122 in the channel region 114N of the transistor 110N. As previously explained, a corresponding high tensile stress of the spacer structure 118 of the second transistor 110P may also be transferred into its channel region 114P, thereby reducing the effect of the embedded semiconductor layer 113 and thus reducing the strain 123 and hence the gain in performance of the transistor 110P. However, contrary to conventional approaches, the spacer structure 118 may be designed to generate a desired degree of tensile strain in the channel region 114N of the first transistor 110N, irrespective of any negative influence created thereby in the second transistor 110P, as an efficient compensation mechanism will be provided, as will be described in more detail with reference to FIG. 1d later on.

For example, the spacer structure 118 may comprise the one or more spacer elements 119, 121 in the form of silicon nitride spacers, which may be formed with high tensile stress ranging up to approximately 1.5 GPa (Giga Pascal), wherein the magnitude of tensile stress may be adjusted by deposition parameters during the deposition of corresponding spacer layers. Consequently, at this stage of manufacture, in the first transistor 110N, the channel region 114N exhibits the first type of strain 122, which is caused by the first type of stress of the spacer structure 118. On the other side, the channel region 114P of the second transistor 110P may exhibit the second type of strain 123, which is mainly caused by the strained semiconductor layer 113, while the effective magnitude of the strain 123 is reduced by the stressed spacer structure 118.

Moreover, in this stage of manufacture, the first and second transistors 110N, 110P may each comprise a metal silicide region 116 within the gate electrodes 105 and corresponding metal silicide regions 117 formed in the respective drain and source regions 115.

A typical process flow for forming the semiconductor device as shown in FIG. 1c may comprise the following processes. After the epitaxial growth of the embedded strained semiconductor layer 113, the spacer structures 118 may be formed on the basis of well-established process techniques, wherein, however, process parameters are selected such that a desired tensile stress is achieved in the spacer structure 118 in accordance with design requirements for the first transistor 110N. For this purpose, the design of the spacer structure 118 may be based on the requirements for the masking effect during any implantation processes for forming the drain and source regions 115 and for providing a self-aligned process for the formation of the metal silicide regions 116 and 117. Furthermore, the design of the spacer structure 118 may also be based on stress considerations so as to obtain the desired degree of strain in the region 114N of the first transistor 110N. That is, the spacer structure 118 may be formed on the basis of design criteria, such as internal stress of the spacer layer and spacer width, wherein the spacer width may also determine the masking effect during the implantation processes. For example, a first spacer or offset spacer (not shown) may be formed and a corresponding implantation sequence may be performed to provide a shallow dopant profile for the drain and source regions 115. Thereafter, a liner layer 120A followed by a spacer layer having an intrinsic stress of the first type, such as a tensile stress, may be deposited on the basis of well-established recipes, in which process parameters may be controlled to achieve the desired high internal stress. For example, the deposition of silicon nitride may be controlled to provide compressive as well as tensile stress, depending on the deposition parameters, such as pressure, temperature, ion bombardment during deposition and the like.

After the deposition of the spacer layer, for instance comprised of silicon nitride having the specified internal stress, a corresponding anisotropic etch process is performed to form the spacer element 121. Thereafter, a further implantation process may be performed, depending on the design requirements, and thereafter the liner 120 may be deposited, which may serve as an etch stop layer during a subsequent anisotropic process for etching a further spacer layer deposited on the liner 120 and exhibiting a specified stress, as is explained with reference to the spacer element 121. After a further anisotropic etch process, the spacer element 119 is formed and a subsequent implantation process may be performed.

It should be appreciated that the spacer structure 118 of the first and second transistors 110N, 110P may be formed in a common process, thereby reducing process complexity. It should be appreciated, however, that the respective implantation sequence may be performed differently for the first and second transistors 110N, 110P by providing respective implantation masks in accordance with well-established techniques.

Thereafter, anneal cycles may be performed to activate the dopants and, at least partially, re-crystallize any implantation-induced damage in the drain and source regions 115. Next, an appropriate process sequence for forming the metal silicide regions 116 and 117 may be performed. For example, one or more appropriate refractory metals may be deposited and a corresponding chemical reaction may be initiated by an appropriately designed heat treatment. For example, cobalt silicide, nickel silicide and the like may be formed in the regions 116 and 117, wherein, depending on the process strategy, two or more different metal silicides may be formed in the respective regions 117.

Figure 1D:
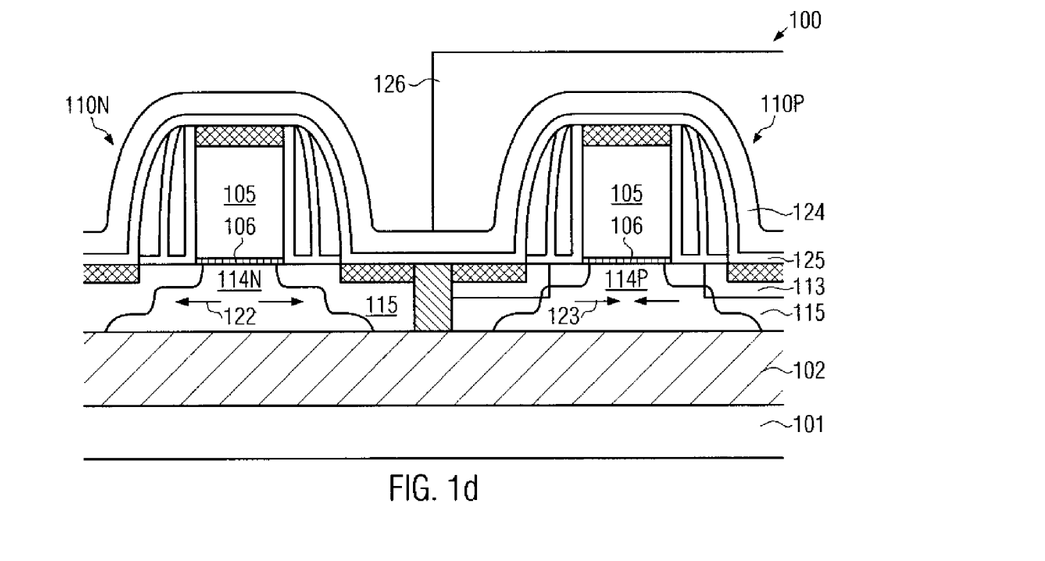

FIG. 1d schematically shows the semiconductor device 100 in a further advanced manufacturing stage. The device 100 comprises a contact etch stop layer 124 having an intrinsic stress that is to be transferred into the channel region 114P of the second transistor 110P to compensate for, or at least reduce the stress induced by, the spacer structure 118 in the second transistor 110P. For convenience, the contact etch stop layer 124 is also referred to as a second contact etch stop layer, whereas a first contact etch stop layer is still to be formed above the first transistor 110N. As previously explained with reference to the spacer structure 118, silicon nitride is an appropriate material for the second contact etch stop layer 124, since it may be deposited with compressive or tensile stress, depending on the process parameters selected. In the embodiment shown, the second contact etch stop layer 124 is formed so as to have a high compressive stress, the magnitude of which may, in one illustrative embodiment, be higher than a corresponding magnitude of the tensile stress of the spacer structure 118. Irrespective of the magnitude of the stress of the layer 124, a significant contribution to the overall strain 123 in the channel region 114P of the second transistor 110P may be obtained, thereby significantly enhancing the overall performance of the transistor 110P.

In some illustrative embodiments, the magnitude of the internal stress of the layer 124 may be selected such that the corresponding stress of the spacer structure 118 may be over-compensated for, i.e., the resulting strain 123 in the channel region 114P may be higher compared to an identical device 110P, in which the only strain inducing source would be the embedded strained semiconductor layer 113. That is, the effect of the contact etch stop layer 124 on the strain 123 is higher than the corresponding effect of the spacer structure 118. In one illustrative embodiment, a liner 125 may additionally be provided that exhibits a high etch selectivity with respect to the layer 124 so as to act as an etch stop layer during a subsequent partial removal of the layer 124 above the first transistor element 110N. For example, the liner 125 may be comprised of silicon dioxide. In other embodiments, the liner 125 may be omitted when any damage in the first transistor element 110N during the subsequent etch process may be considered as tolerable. Moreover, an etch mask 126 is formed above the device 100 to cover the second transistor 110P while exposing the first transistor 110N.

As previously explained, the layers 124 and 125, if provided, may be formed on the basis of well-established deposition techniques, wherein, during the deposition of the second contact etch stop layer 124, the process parameters are selected such that the required internal stress is achieved. For instance, during the deposition of silicon nitride by PECVD, the degree of ion bombardment may be controlled in such a manner that a high compressive or tensile stress, depending on the process requirements, is achieved. Thereafter, a selective etch process is performed so as to remove a portion of the etch stop contact layer 124 above the first transistor element 110N, wherein the optional liner 125 may serve as an etch stop layer, thereby avoiding or at least reducing any damage that may otherwise affect the respective metal silicide regions 116 and 117 of the first transistor 110N.

Figure 1E:
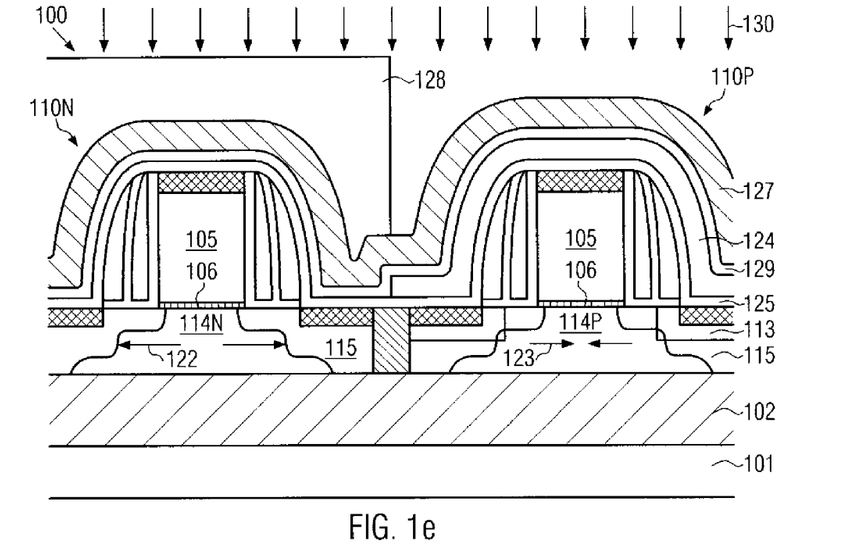

FIG. 1e schematically shows the semiconductor device 100 in a further advanced manufacturing stage. A first contact etch stop layer 127 is formed above the first and second transistors 110N, 110P, wherein, in one illustrative embodiment, a further liner 129 is formed above the first transistor 110N and on the non-removed portion of the second contact etch stop layer 124. The liner 129 may also exhibit a high etch selectivity with respect to the material of the first contact etch stop layer 127 or, in other embodiments, the liner 129 may represent an etch indicator layer which may be used during a subsequent etch process 130 for removing a portion of the first contact etch stop layer 127 above the second transistor element 110P on the basis of a corresponding etch mask 128. The first contact etch stop layer 127 exhibits internal stress corresponding to a first type of stress as may also be provided in the spacer structure 118, thereby enhancing the total effect on the strain 122 within the channel region 114 of the first transistor 110N. Thus, in case of a tensile stress for the spacer structure 118, the layer 127 may be formed to also exhibit a tensile stress of a specified magnitude. For example, the layer 127 may be provided in the form of a tensile silicon nitride layer. Thus, compared to the device as shown in FIG. 1c, the tensile strain 122 is significantly increased, thereby further enhancing the electron mobility and hence the electrical performance of the first transistor 110N. Since the layer 127 is removed above the second transistor 110P, any effect on the corresponding strain 123 in the respective channel region 114P may be avoided or reduced and thus the enhanced whole mobility, obtained by the embedded strained semiconductor layer 113 and the internal stress of the second contact etch stop layer 124 which may compensate for or over-compensate for a tensile stress of the spacer structure 118, is still maintained. After the removal of the exposed portion of the first contact etch stop layer 127, further processing may be performed by depositing a corresponding interlayer dielectric (not shown) followed by the formation of respective contact openings, wherein the first and second contact etch stop layers 127, 124 may act as etch stops as is well known in the art. Thereafter, any further backend processes, that is manufacturing processes for forming one or more metallization layers, may be carried out.

Thus, the semiconductor device 100 comprises the first transistor 110N, which includes the highly stressed spacer structure 118 and also the first contact etch stop layer 127, which, in combination, provide efficient stress transfer into the respective channel region 114N to create the enhanced strain 122 therein. Consequently, the first transistor 110N comprises multiple stress sources in the form of the spacer structure 118, which may be adjusted on the basis of deposition parameters and the corresponding spacer width. Moreover, the stressed contact etch stop layer 127 represents another stress source, which may be scaled depending on the technology used, i.e., depending on the spacing between neighboring transistor elements, while the magnitude and type of stress may be readily adjusted by an appropriate selection of process parameters.

On the other hand, the device 100 comprises the second transistor 110P having the embedded strained semiconductor layer 113 as a scalable stress source, wherein the magnitude of the strain 123 induced in the channel region 114P may be selected on the basis of the type of semiconductor material used, for instance the germanium concentration, when a silicon/germanium layer is considered and may also be adjusted on the basis of the fill height, i.e., on the basis of the size of the corresponding recess (FIG. 1b).

The fact that multiple stress inducing sources are provided for each type of transistor provides the possibility to adjust product specifications substantially without any redesign of a given circuit layout while at the same time a significant performance improvement is obtained.

With reference to FIGS. 1f-1i, further illustrative embodiments will now be described in which the stress transfer via the first and second contact etch stop layers 127 and 124 may be even further enhanced by depositing one or both of these layers directly on the respective transistor elements.

Figure 1F:
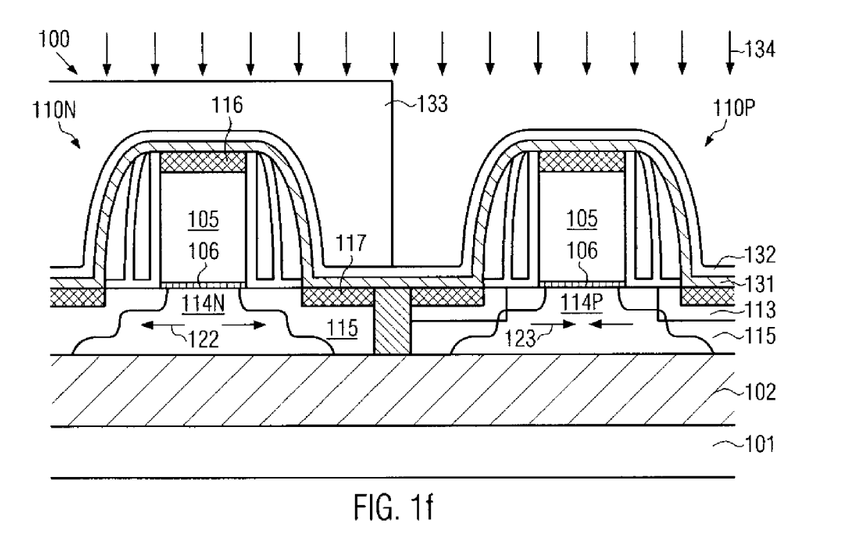
FIGS. 1f-1i schematically show cross-sectional views of the semiconductor device as illustrated in FIGS. 1a-1e, wherein the stress transfer from a contact etch stop layer is enhanced by forming respective layers directly on the respective transistors.

In FIG. 1f, the device 100 comprises, in addition to what is shown in FIG. 1c, a first liner 131 that is formed directly on the first and second transistors 110N, 110P. The term "formed directly on the transistor" is meant to describe the situation that the corresponding layer is in contact with the metal silicide regions 116 and 117. The first liner 131 may be formed as a stressed liner, such as a silicon nitride liner having a specified type of stress. In the example shown, the first liner 131 may have the first type of stress so as to assist the sidewall spacer structure 118 in generating the desired strain 122 in the channel region 114N of the first transistor 110N. Thus, when the transistor 110N represents an N-channel transistor, the first liner 131 may comprise tensile stress. Furthermore, a second liner 132 is formed on the first liner 131, wherein the first and second liners 131 and 132 may exhibit a high degree of etch selectivity with respect to a specified etch recipe. For example, the second liner 132 may be comprised of silicon dioxide. Furthermore, an etch mask 133 is formed above the device 100 to cover the first transistor 110N while exposing the second transistor 110P. Moreover, the device 100 is subjected to an etch process 134, during which the exposed portion of the second liner 132 and, thereafter, the exposed portion of the layer 131 may be removed, wherein, in this stage of manufacture, the layers 131 and 132 exhibit a high degree of uniformity due to the absence of any preceding etch processes, thereby allowing an efficient removal of the exposed portions from the second transistor 110P without creating undue damage in the respective metal silicide regions 116, 117 of the second transistor 110P.

Figure 1G:
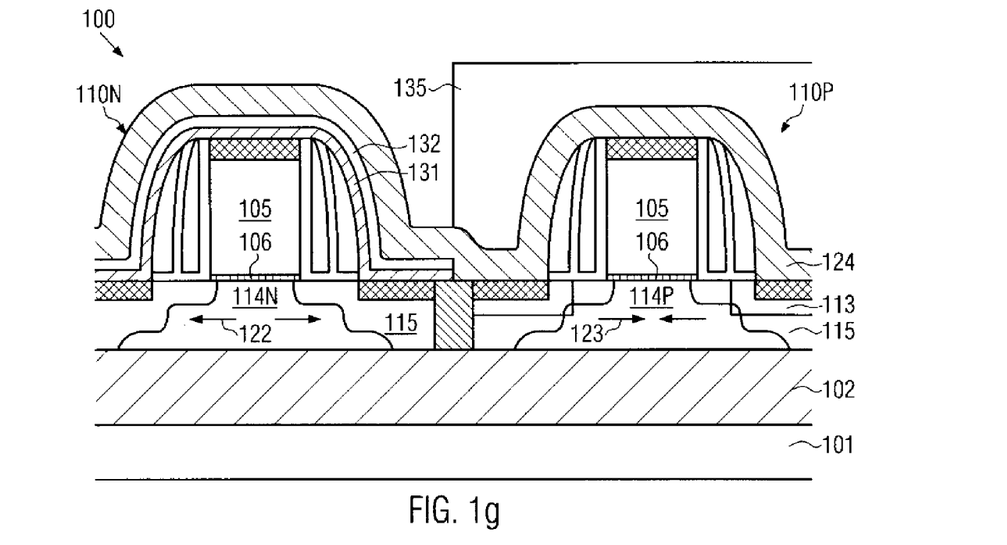

FIG. 1g schematically shows the semiconductor device 100 after the removal of the exposed portions of the first and second liners 131 and 132 and the formation of the second contact etch stop layer 124. Regarding the characteristics of the contact etch stop layer 124, the same criteria apply as explained above. Moreover, an etch mask 135 may be provided to expose the portion of the contact etch stop layer 124 above the first transistor 110N.

Figure 1H:
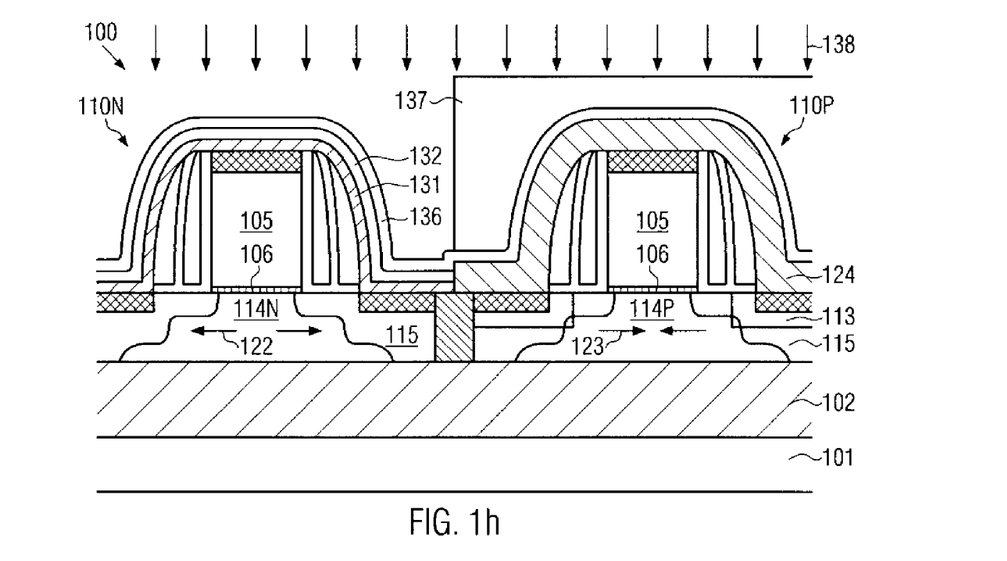

FIG. 1h schematically shows the device 100 after the removal of the exposed portion of the layer 124, wherein a corresponding etch process may be reliably stopped on the second liner 132, as is also described above with respect to the liner 125. Moreover, a third liner 136 may be formed above the first transistor 110N and on the remaining portion of the second contact etch stop layer 124. For example, the third liner 136 may be comprised of silicon dioxide. Thereafter, a further etch mask 137 may be formed to expose the first transistor 110N while covering the second transistor 110P. The device 100 is subjected to a selective etch process 138 that is designed to selectively remove the exposed portions of the second and third liners 132, 136 while substantially not attacking the stressed liner 131. For example, highly selective etch processes for silicon dioxide with respect to silicon nitride are well established in the art. After the removal of the exposed portions of the liners 132, 136, the mask 137 may be removed and the first contact etch stop layer 127 may be deposited in the same way as previously described.

Figure 1I:
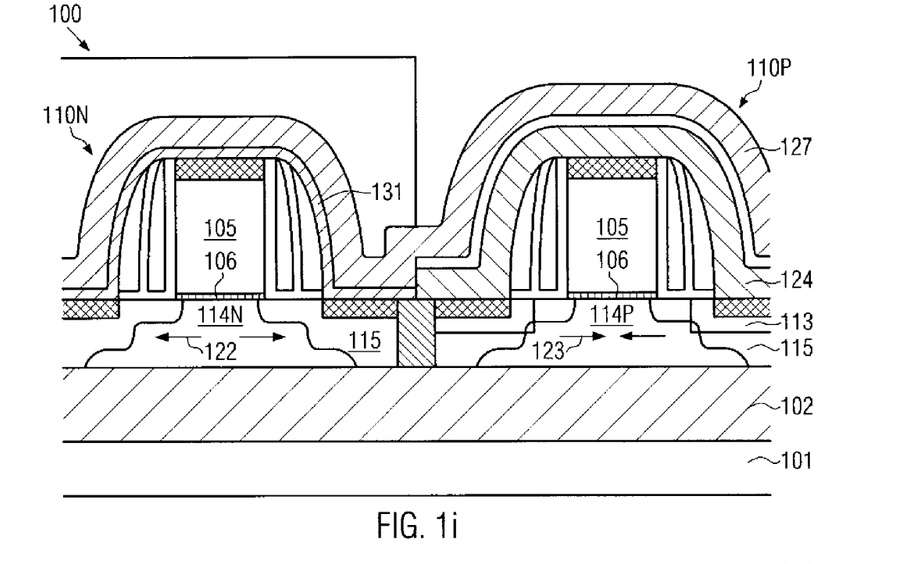

FIG. 1i schematically shows the semiconductor device 100 after the formation of the first contact etch stop layer 127 having the same type of stress as the first liner 131. Moreover, the first contact etch stop layer 127 may be removed above the second transistor 110P as is also previously described. Consequently, both strain inducing layers 127 and 124 may be directly formed on the respective transistor elements 110N, 110P. Therefore, the corresponding stress transferring mechanism may be significantly enhanced.

Figure 2A:
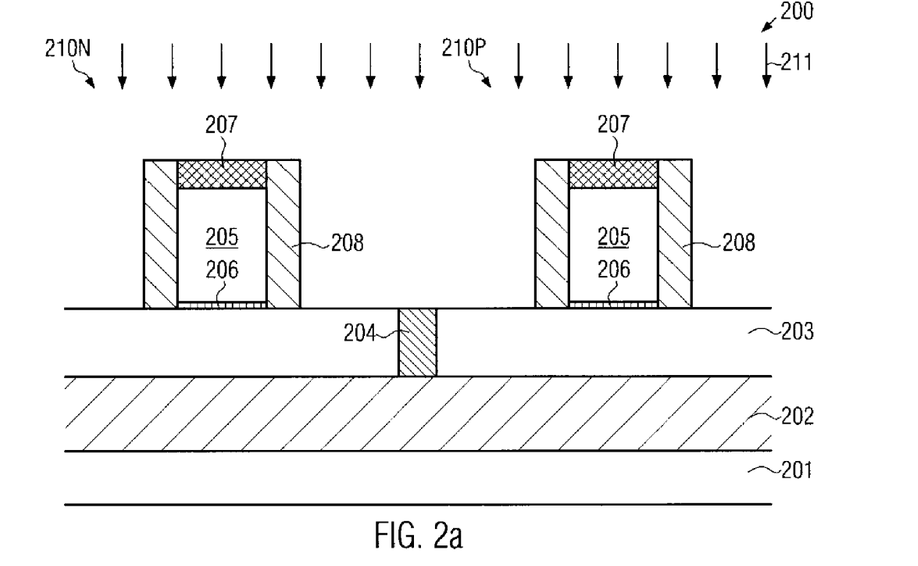
FIGS. 2a-2c schematically show cross-sectional views of a semiconductor device during various manufacturing stages, wherein a strained and a relaxed semiconductor layer are formed in respective drain and source regions of different transistor types in accordance with still other illustrative embodiments of the present invention.
Figure 2B:
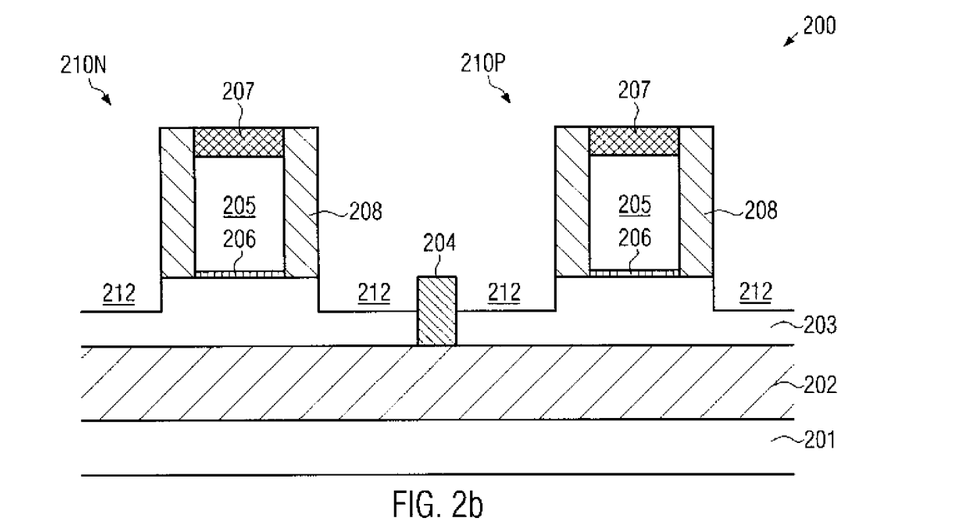
Figure 2C:
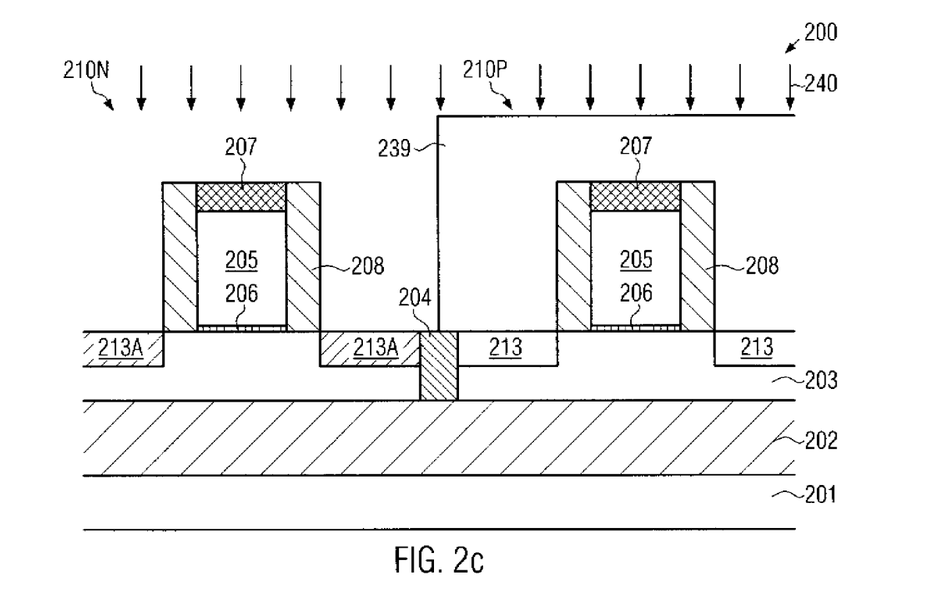

With reference to FIGS. 2a-2c, further illustrative embodiments of the present invention will now be described, wherein enhanced process uniformity may be achieved by performing a respective cavity etch process and a subsequent epitaxial growth process symmetrically with respect to different types of transistors.

FIG. 2a schematically shows a semiconductor device 200 which may have essentially the same configuration as the device 100 as shown in FIG. 1a, except for a missing hard mask. Thus, the same components are indicated by the same reference numerals except for a leading "2" instead of a leading "1." With respect to these components and the fabrication thereof, therefore, the same criteria apply as previously explained with reference to FIG. 1a. Consequently, the gate electrode 205 of the first and second transistors 210N, 210P are encapsulated by the respective capping layers 207 and the spacer elements 208. As is well known, many processes, such as etch processes, deposition processes and the like, may exhibit a more or less pronounced dependence on pattern density, which may also be referred to as a "loading or micro-loading" effect, when an etch process is considered. Therefore, in this embodiment, an enhanced uniformity of etch process 211 may be achieved by also performing the etch process 211 on the first transistor 210N, rather than etching a respective recess 112 only adjacent to the second transistor 210P. Since the etch process 211 may be substantially controlled on the basis of the etch time, an enhanced across-substrate uniformity may also result in an improved uniformity of the corresponding recesses, thereby providing enhanced process control and uniformity in performance of the device 200.

FIG. 2b schematically shows the semiconductor device 200 after the completion of the etch process 211. Consequently, respective recesses 212 are formed adjacent to the first and second transistors 210N, 210P. Next, the device 200 may be prepared for a subsequent epitaxial growth process and appropriate well-established cleaning processes may be performed in order to remove any contaminants from exposed surfaces of the recesses 212. Thereafter, an appropriate deposition atmosphere is provided on the basis of well-established recipes, for instance for depositing silicon/germanium in a highly selective manner. A selective epitaxial growth process may also suffer from loading effects that may modify the local growth rate and also the local dopant incorporation when an appropriate dopant material is simultaneously deposited commonly with the semiconductor material. As with the etch process 211, the lack of any epitaxial growth mask, as is for instance provided in the embodiments described above, may significantly enhance the uniformity of the selective epitaxial growth process. Thus, process uniformity may be enhanced during the epitaxial growth.

FIG. 2c schematically shows the device 200 in a further advanced manufacturing stage, after the completion of the above-described epitaxial growth process. Consequently, the respective recesses 212 are filled or over-filled (not shown) with a strained semiconductor material, such as silicon/germanium 213. Moreover, the device 200 is subjected to a treatment 240 on the basis of a mask 239 that exposes the first transistor 210N, while covering the second transistor 210P. The treatment 240, which may represent an ion bombardment on the basis of a heavy inert species, such as xenon and the like, may be designed such that a certain degree of strain relaxation is obtained. That is, the strained layer 213 may be converted into a substantially relaxed layer 213A to substantially avoid a stress transfer into the respective channel region of the first transistor 210N. After the treatment 240 and the removal of the mask 239, the further processing may be continued as is also described with reference to FIGS. 1c-1i. Consequently, as previously explained, in addition to an enhanced uniformity of the corresponding cavity etch process and the epitaxial growth process, a reduced junction resistance in the first transistor 210N may be obtained, when silicon/germanium is provided as the material 213A. Consequently, especially for partially depleted SOI devices, a more enhanced performance gain may be achieved.

As a result, the present invention provides a technique for the formation of different types of transistor elements, such as PMOS and NMOS transistors, wherein two or more stress inducing mechanisms are provided for each type of transistor, thereby providing a high degree of flexibility in adjusting product specific characteristics. Consequently, any efforts in redesigning a circuit layout may be significantly reduced, since existing designs may be efficiently reused by correspondingly adapting a corresponding strain inducing mechanism. For example, in PMOS transistors, the highly efficient strain creating mechanism of an embedded strained silicon/germanium layer may be advantageously combined with the provision of a compressively stressed contact etch stop layer, which may compensate for or even over-compensate for the high tensile stress in the respective spacer structure, which may therefore be designed to create the desired degree of strain in the NMOS transistor. Furthermore, the strain in the NMOS transistor may be even further enhanced by providing a corresponding contact etch stop layer having a high tensile stress. Moreover, in some embodiments, the stress transfer mechanism from the corresponding contact etch stop layers may be enhanced by forming these layers directly on the corresponding transistor element.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first gate electrode of a first transistor of a first type and a second gate electrode of a second transistor of a second type;
    forming a strained semiconductor layer in a recess formed adjacent to said second gate electrode;
    forming a first sidewall spacer structure at said first gate electrode and a second sidewall spacer structure at said second gate electrode, said first and second sidewall spacer structures having a first type of stress;
    forming a first contact etch stop layer above said first transistor, said first contact etch stop layer having said first type of stress; and
    forming a second contact etch stop layer above said second transistor, said second contact etch stop layer having a second type of stress other than said first type, wherein forming said second contact etch stop layer comprises selecting a magnitude of said second type of stress so as to at least compensate for said first type of stress in said second sidewall spacer structure.

2. The method of claim 1, wherein forming said first and second contact etch stop layers comprises forming one of said first and second contact etch stop layers above said first and second transistors, selectively removing a portion of said one of the first and the second contact etch stop layers from one of the first and second transistors, and forming the other one of said first and second contact etch stop layers.

3. The method of claim 1, wherein forming said first and second sidewall spacer structures comprises depositing a first spacer layer having said first type of stress and anisotropically etching said first spacer layer to form a first spacer of said first and second sidewall spacer structures.

4. The method of claim 3, wherein depositing said first spacer layer comprises adjusting one or more deposition parameters on the basis of a target value for a first specified magnitude of said first type of stress in said first sidewall spacer structure.

5. The method of claim 3, wherein forming said first and second sidewall spacer structures comprises depositing a second spacer layer having said first type of stress and anisotropically etching said second spacer layer to form a second spacer of said first and second sidewall spacer structures.

6. The method of claim 5, wherein depositing said second spacer layer comprises adjusting one or more deposition parameters on the basis of a target value for a second specified magnitude of said first type of stress in said second sidewall spacer structure.

7. The method of claim 1, wherein said magnitude of said second type of stress of said second contact etch stop layer is selected so as to over-compensate for said first type of stress in said second sidewall spacer structure.

8. The method of claim 1, further comprising forming a recess adjacent to said first gate electrode and forming said semiconductor layer commonly in said recesses located adjacent to said first and second gate electrodes.

9. The method of claim 8, wherein said semiconductor layer in said first transistor is provided as a substantially relaxed semiconductor layer.

10. The method of claim 1, further comprising forming an etch stop layer above said first and second transistors prior to forming said first and second contact etch stop layers, and removing said etch stop layer at least above said second transistor prior to forming said second contact etch stop layer.

11. The method of claim 10, wherein said etch stop layer comprises a stressed layer having the first type of stress.

12. The method of claim 1, wherein the strained semiconductor layer has the second type of stress.

13. The method of claim 1, wherein the strained semiconductor layer has the second type of stress.

14. A method, comprising:
forming a first gate electrode of a first transistor of a first type and a second gate electrode of a second transistor of a second type;
forming a strained semiconductor layer in a recess formed adjacent to said second gate electrode;
forming a first sidewall spacer structure at said first gate electrode and a second sidewall spacer structure at said second gate electrode, said first and second sidewall spacer structures having a first type of stress, wherein forming said first and second sidewall spacer structures comprises depositing a first spacer layer having said first type of stress, anisotropically etching said first spacer layer to form a first spacer of said first and second sidewall spacer structures, depositing a second spacer layer having said first type of stress, and anisotropically etching said second spacer layer to form a second spacer of said first and second sidewall spacer structures;
forming a first contact etch stop layer above said first transistor, said first contact etch stop layer having said first type of stress; and
forming a second contact etch stop layer above said second transistor, said second contact etch stop layer having a second type of stress other than said first type.

15. The method of claim 14, wherein forming said first and second sidewall spacer structures comprises adjusting one or more deposition parameters for depositing the first spacer layer on the basis of a target value for a first specified magnitude of said first type of stress in said first sidewall spacer structure.

16. The method of claim 15, wherein forming said first and second sidewall spacer structures comprises adjusting one or more deposition parameters for depositing the second spacer layer on the basis of a target value for a second specified magnitude of said first type of stress in said second sidewall spacer structure.

17. The method of claim 14, wherein said magnitude of said second type of stress of said second contact etch stop layer is selected so as to over-compensate for said first type of stress in said second sidewall spacer structure.

18. The method of claim 14, further comprising forming an etch stop layer above said first and second transistors prior to forming said first and second contact etch stop layers, wherein said etch stop layer comprises a stressed layer having the first type of stress, and removing said etch stop layer at least above said second transistor prior to forming said second contact etch stop layer.

19. The method of claim 14, wherein the strained semiconductor layer has the second type of stress.

20. A method, comprising:
forming a first gate electrode of a first transistor of a first type and a second gate electrode of a second transistor of a second type;
forming a strained semiconductor layer in a recess formed adjacent to said second gate electrode;
forming a first sidewall spacer structure at said first gate electrode and a second sidewall spacer structure at said second gate electrode, said first and second sidewall spacer structures having a first type of stress;
forming a first contact etch stop layer above said first transistor, said first contact etch stop layer having said first type of stress;
forming a second contact etch stop layer above said second transistor, said second contact etch stop layer having a second type of stress other than said first type;
forming an etch stop layer above said first and second transistors prior to forming said first and second contact etch stop layers; and
removing said etch stop layer at least above said second transistor prior to forming said second contact etch stop layer.

21. The method of claim 20, wherein said etch stop layer comprises a stressed layer having the first type of stress.

22. The method of claim 20, wherein the strained semiconductor layer has the second type of stress.

23. The method of claim 20, wherein said magnitude of said second type of stress of said second contact etch stop layer is selected so as to over-compensate for said first type of stress in said second sidewall spacer structure.

24. The method of claim 23, wherein said semiconductor layer in said first transistor is provided as a substantially relaxed semiconductor layer.

25. The method of claim 20, further comprising forming a recess adjacent to said first gate electrode and forming said semiconductor layer commonly in said recesses located adjacent to said first and second gate electrodes.

26. A method, comprising:
forming a first gate electrode of a first transistor of a first type and a second gate electrode of a second transistor of a second type;
forming a strained semiconductor layer in a recess formed adjacent to said second gate electrode;
forming a first sidewall spacer structure at said first gate electrode and a second sidewall spacer structure at said second gate electrode, said first and second sidewall spacer structures having a first type of stress, wherein forming said first and second sidewall spacer structures comprises depositing a first spacer layer having said first type of stress, adjusting one or more deposition parameters for depositing the first spacer layer on the basis of a target value for a first specified magnitude of said first type of stress in said first sidewall spacer structure, and anisotropically etching said first spacer layer to form a first spacer of said first and second sidewall spacer structures;
forming a first contact etch stop layer above said first transistor, said first contact etch stop layer having said first type of stress; and
forming a second contact etch stop layer above said second transistor, said second contact etch stop layer having a second type of stress other than said first type.

27. The method of claim 26, wherein forming said first and second sidewall spacer structures comprises depositing a second spacer layer having said first type of stress and anisotropically etching said second spacer layer to form a second spacer of said first and second sidewall spacer structures.

28. The method of claim 27, wherein depositing said second spacer layer comprises adjusting one or more deposition parameters on the basis of a target value for a second specified magnitude of said first type of stress in said second sidewall spacer structure.

29. The method of claim 26, wherein said magnitude of said second type of stress of said second contact etch stop layer is selected so as to over-compensate for said first type of stress in said second sidewall spacer structure.

* * * * *